(12) United States Patent
Willshere et al.

(10) Patent No.: US 8,794,138 B2
(45) Date of Patent: Aug. 5, 2014

(54) SCREEN PRINTING APPARATUS AND METHOD

(76) Inventors: Jeffrey Richard Willshere, Dorchester (GB); Martin Symons, Weymouth (GB)

( * ) Notice: Subject to any disclaimer, the term of this patent is extended or adjusted under 35 U.S.C. 154(b) by 479 days.

(21) Appl. No.: 13/126,872

(22) PCT Filed: Oct. 29, 2009

(86) PCT No.: PCT/GB2009/002574
§ 371 (c)(1), (2), (4) Date: Dec. 23, 2011

(87) PCT Pub. No.: WO2010/049692
PCT Pub. Date: May 6, 2010

(65) Prior Publication Data
US 2012/0090483 A1    Apr. 19, 2012

(30) Foreign Application Priority Data

Oct. 31, 2008 (GB) .................................. 0820024.8

(51) Int. Cl.
- B41F 35/00 (2006.01)
- B41F 33/00 (2006.01)
- B41F 35/02 (2006.01)

(52) U.S. Cl.
USPC ............ 101/123; 101/129; 101/424; 101/425

(58) Field of Classification Search
USPC ......... 101/114, 126, 127, 129, 485, 423, 424, 101/425
See application file for complete search history.

(56) References Cited

U.S. PATENT DOCUMENTS

| | | | |
|---|---|---|---|
| 6,036,787 A * | 3/2000 | Bennett et al. | 134/21 |
| 6,189,448 B1 | 2/2001 | O'Neal et al. | 101/127 |
| 2005/0183600 A1 * | 8/2005 | Perault et al. | 101/425 |
| 2008/0121124 A1 * | 5/2008 | Sato | 101/123 |

FOREIGN PATENT DOCUMENTS

| | | | | |
|---|---|---|---|---|
| CN | 201030666 | * | 3/2008 | B41J 15/08 |
| GB | 2 399 788 | | 9/2004 | B41N 35/00 |
| WO | 03/103965 | | 12/2003 | B41F 15/36 |
| WO | 2005/082624 | | 9/2005 | B41F 35/00 |

OTHER PUBLICATIONS

International Search Report for corresponding patent application No. PCT/GB2009/002574 dated Feb. 22, 2011.

* cited by examiner

*Primary Examiner* — Ren Yan
*Assistant Examiner* — Marissa Ferguson Samreth
(74) *Attorney, Agent, or Firm* — Renner, Otto, Boisselle & Sklar, LLP

(57) ABSTRACT

A screen printing apparatus and method for printing deposits of a print medium on workpieces, the apparatus comprising: a frame support unit for supporting a printing screen unit which comprises a screen sheet which includes at least first and second patterns of print apertures; a workpiece support unit; a print head unit; and at least one screen cleaning unit; wherein the at least one screen cleaning unit and the print head unit are operated in parallel, whereby, when the printing screen unit is in the first printing position, the at least one screen cleaning unit cleans the underside of the screen sheet at a location corresponding to one of the first and second sets of print apertures and the print head unit prints print medium onto workpieces through the other of the first and second sets of print apertures.

19 Claims, 14 Drawing Sheets

SCREEN PRINTING APPARATUS AND METHOD

This application is a national phase of International Application No. PCT/GB2009/002574 filed Oct. 29, 2009 and published in the English language.

The present invention relates to a screen printing apparatus and method for printing deposits of a print medium onto workpieces, typically substrates, such as circuit boards or wafers, through a printing screen, often alternatively referred to as stencils or foils.

In the screen printing process, particularly in the SMT industry, printing screens gradually become contaminated owing to the build up of print medium on the printing screen, typically as a result of print medium bleeding out between the printing screen and the workpiece which dries on the surface of the printing screen and the collection of print medium in the printing apertures which dries to clog the printing apertures.

Current screen printing machines incorporate a screen cleaning unit which is periodically operated to clean the underside of the printing screen. These screen cleaning units operate through the application of solvent, a screen cleaning cloth which is applied to the underside of the printing screen by a wiping mechanism and vacuum to collect waste print medium cleaned from the printing screen.

These screen cleaning units function effectively, but require the printing operation to be stopped in order to perform the cleaning operation, and thus reduce the throughput of the screen printing machines. This is at a time when the users are increasingly requiring increased throughput, in order to maintain a competitive advantage.

It is an aim of the present invention to provide a screen printing apparatus and method, which provides for cleaning of the printing screen and achieves an increased throughput as compared to that achieved by these existing screen printing machines.

The present inventors have recognized that significant improvements can be achieved by performing the printing and cleaning operations in parallel.

For example, in these existing screen printing apparatus, if cleaning is required every three prints and the cleaning cycle takes fifteen seconds, then the effective throughput time for each workpiece effectively attracts an additional five seconds, which is attributed to the cleaning operation. Thus, if the throughput time for the printing operation were ten seconds, the hourly output would be 360 workpieces, but, with an effective cleaning cycle of five seconds per workpiece, the hourly output would be reduced to 240 workpieces.

The present inventors have recognized that improved operation can be achieved by providing at least two duplicated sets of printing apertures in the printing screen, thereby allowing parallel printing and cleaning operations, in which a printing operation is performed using one of the sets of printing apertures and a cleaning operation is performed on another of the sets of printing apertures, whereby a clean set of printing apertures is always ready for use.

In one aspect the present invention provides a screen printing apparatus for printing deposits of a print medium on workpieces, the apparatus comprising: a frame support unit for supporting a printing screen unit which comprises a screen sheet which includes at least first and second patterns of print apertures; a workpiece support unit operable to support a workpiece adjacent the underside of the screen sheet; a print head unit which includes a print head for driving a print medium through one of the first and second patterns of print apertures in the screen sheet to print a pattern of deposits on a workpiece supported on the workpiece support unit; and at least one screen cleaning unit which includes a cleaning head unit for cleaning the underside of the screen sheet; wherein the at least one screen cleaning unit and the print head unit are operable in parallel, whereby, when the printing screen unit is in the first printing position, the at least one screen cleaning unit cleans the underside of the screen sheet at a location corresponding to one of the first and second sets of print apertures and the print head unit prints print medium onto workpieces through the other of the first and second sets of print apertures, and, when the printing screen unit is in the second printing position, the at least one screen cleaning unit cleans the underside of the screen sheet at a location corresponding to the other of the first and second sets of print apertures and the print head unit prints print medium onto workpieces through the one of the first and second sets of print apertures.

In one embodiment the frame support unit comprises a positioning mechanism for positioning the printing screen unit in one of the first and second printing positions.

In one embodiment the print head comprises one of an enclosed print head or a squeegee mechanism.

In one embodiment the workpiece support unit includes a support section which is movable between a first, receiving position in which a workpiece is received thereon and a second, printing position in which a workpiece is supported adjacent the underside of the screen sheet.

In one embodiment the apparatus comprises: a single screen cleaning unit, wherein the cleaning head unit is movable between first and second cleaning locations to opposite sides of the workpiece support unit, whereby the cleaning head unit is operative to clean the underside of the screen sheet at a location corresponding to one of the first and second sets of print apertures when in the first screen cleaning location and with the printing screen unit in the one printing position and a location corresponding to the other of the first and second sets of print apertures when in the second screen cleaning location and with the printing screen unit in the other printing position.

In another embodiment the apparatus comprises: first and second screen cleaning units disposed at locations to opposite sides of the workpiece support unit, wherein the first screen cleaning unit is operative to clean the underside of the screen sheet at a location corresponding to one of the first and second sets of print apertures when the printing screen unit is in the one printing position and a location corresponding to the other of the first and second sets of print apertures when the printing screen unit is in the other printing position.

In one embodiment the screen cleaning units each comprise a cleaning head drive mechanism for moving the cleaning head unit beneath the screen sheet to clean the same, preferably with a reciprocal motion.

In one embodiment the cleaning head unit comprises a support member, a screen cleaning head which is movably coupled to the support member, and an actuator which is operative to move the screen cleaning head between an inoperative position and an operative cleaning position.

In one embodiment the screen cleaning head comprises a solvent applicator for delivering a solvent to clean the underside of the screen sheet, a vacuum source for applying a vacuum to the underside of the screen sheet to collect waste print medium, and a wiping mechanism for wiping the underside of the screen sheet.

In one embodiment the wiping mechanism comprises a supply of a wipe element, which is fed over the solvent applicator and the vacuum source, and a take-up spool which is operative to draw a new section of the wipe element from the supply for each cleaning operation.

In one embodiment the wiping mechanism includes an actuator for driving the take-up spool to draw up a section of the wipe element, and a sensor assembly for determining an amount of the wipe element which is drawn with each operation of the take-up spool.

In one embodiment the supply and the take-up spool are located to one, outer side of the solvent applicator and the vacuum source.

In one embodiment the first and second sets of print apertures are identical.

In another aspect the present invention provides a screen cleaning unit for cleaning the underside of a screen sheet, comprising: a screen cleaning head comprising a solvent applicator for delivering a solvent to clean the underside of the screen sheet, a vacuum source for applying a vacuum to the underside of the screen sheet to collect waste print medium, and a wiping mechanism for wiping the underside of the screen sheet, wherein the wiping mechanism comprises a supply of a wipe element, which is fed over the solvent applicator and the vacuum source, and a take-up spool which is operative to draw a new section of the wipe element from the supply for each cleaning operation, and the supply and the take-up spool are located to one, outer side of the solvent applicator and the vacuum source.

In one embodiment the wiping mechanism includes an actuator for driving the take-up spool to draw up a section of the wipe element, and a sensor assembly for determining an amount of the wipe element which is drawn with each operation of the take-up spool.

In one embodiment the screen cleaning unit further comprises: a support member to which the screen cleaning head is movably coupled to the support member; and an actuator which is operative to move the screen cleaning head between an inoperative position and an operative cleaning position.

In a further aspect the present invention provides a method of printing deposits of a print medium onto workpieces, the method comprising the steps of: providing a printing screen unit which comprises a screen sheet which includes at least first and second sets of print apertures; performing one or more first print cycles on workpieces successively supported to the underside of the screen sheet at a location corresponding to one of the first and second sets of print apertures; performing a first cleaning operation on the underside of the screen sheet at a location corresponding to the other of the first and second sets of print apertures during the step of one or more of the first print cycles; performing one or more second print cycles on workpieces successively supported to the underside of the screen sheet at a location corresponding to the other of the first and second sets of print apertures; and performing a second cleaning operation on the underside of the screen sheet at a location corresponding to the one of the first and second sets of print apertures during the step of performing one or more of the second print cycles.

In one embodiment the workpieces are supported successively by a support section which is movable between a first, receiving position in which a workpiece is received thereon and a second, printing position in which a workpiece is supported adjacent the underside of the screen sheet.

In one embodiment the method further comprises the steps of: positioning the printing screen unit in a first position when performing the one or more first print cycles and the first cleaning operation; and positioning the printing screen unit in a second position when performing the one or more second print cycles and the second cleaning operation.

In one embodiment the first and second cleaning operations are performed by a single screen cleaning unit, which comprises a cleaning head unit which is movable between first and second cleaning locations at opposite sides of the supported workpiece, whereby the cleaning head unit performs the first cleaning operation when in the first screen cleaning location and with the printing screen unit in the first position and the second cleaning operation when in the second screen cleaning location and with the printing screen unit in the second position.

In another embodiment the first and second cleaning operations are performed by first and second screen cleaning units disposed at locations to opposite sides of the supported workpiece, wherein the first screen cleaning unit performs the first cleaning operation when the printing screen unit is in the first printing position and the second cleaning operation when the printing screen unit is in the second printing position.

In one embodiment the screen cleaning units are moved beneath the screen sheet to clean the same, preferably with a reciprocal motion.

In one embodiment the cleaning head unit comprises a support member, a screen cleaning head which is movably coupled to the support member, and an actuator which is operative to move the screen cleaning head between an inoperative position and an operative cleaning position.

In one embodiment the screen cleaning head comprises a solvent applicator for delivering a solvent to clean the underside of the screen sheet, a vacuum source for applying a vacuum to the underside of the screen sheet to collect waste print medium, and a wiping mechanism for wiping the underside of the screen sheet.

In one embodiment the wiping mechanism comprises a supply of a wipe element, which is fed over the solvent applicator and the vacuum source, and a take-up spool which is operative to draw a new section of the wipe element from the supply for each cleaning operation.

In one embodiment the supply and the take-up spool are located to one, outer side of the solvent applicator and the vacuum source.

In one embodiment the first and second sets of print apertures are identical.

Preferred embodiments of the present invention will now be described hereinbelow by way of example only with reference to the accompanying drawings, in which.

Figure 1:
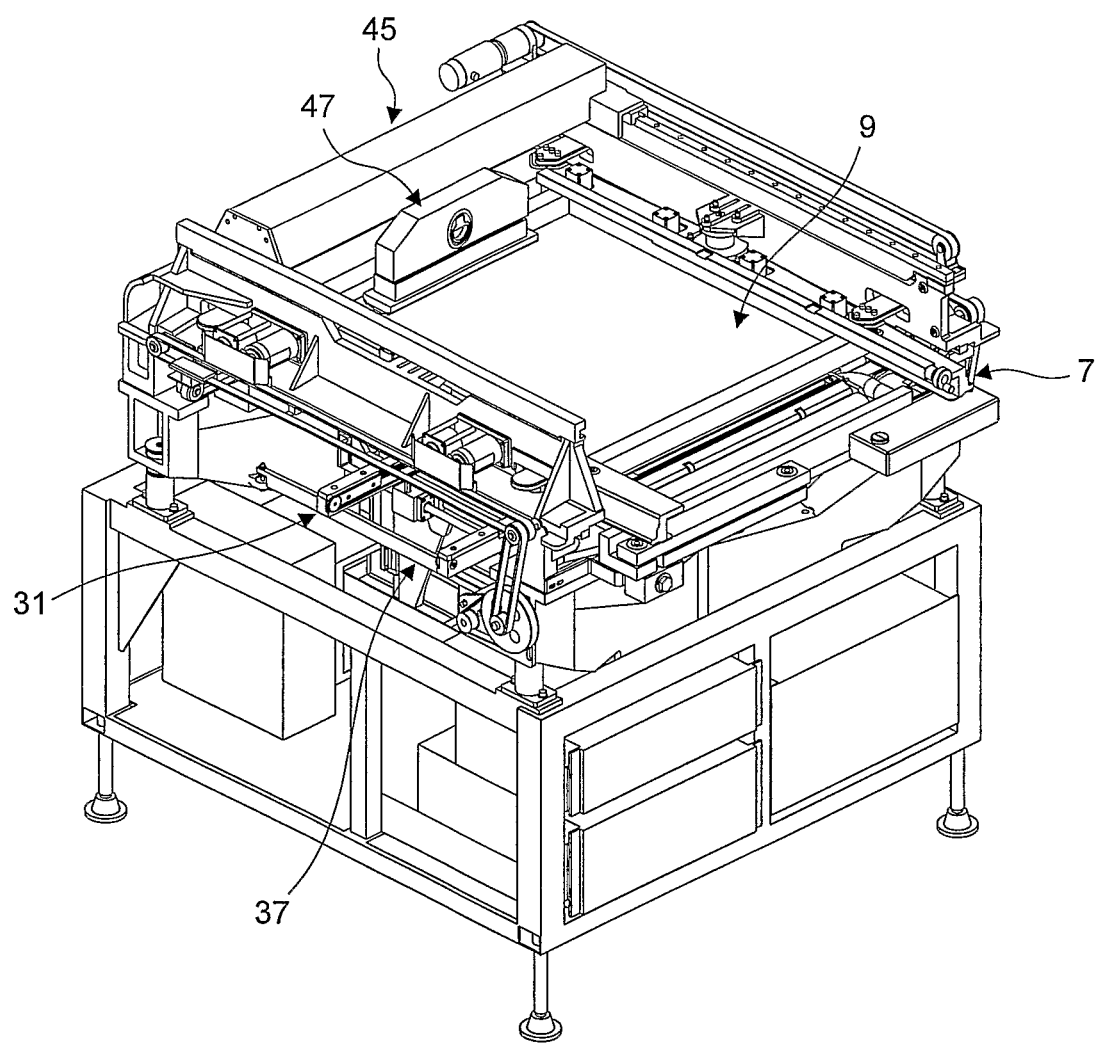
FIG. 1 illustrates a perspective view of a screen printing apparatus in accordance with a first embodiment of the present invention.
Figure 2:
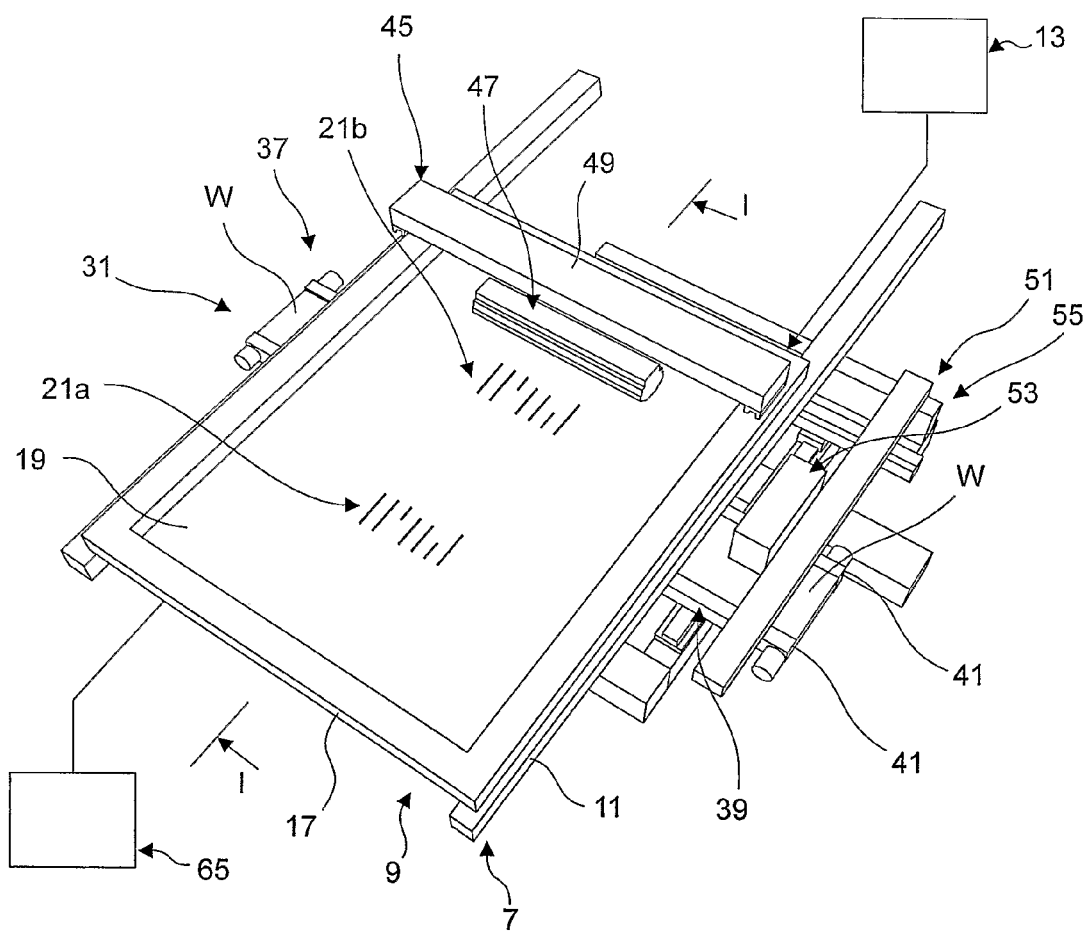
FIG. 2 illustrates a fragmentary, enlarged perspective view of the screen printing apparatus of FIG. 1, with certain of the supporting structure and drive mechanisms being omitted to facilitate understanding.
Figure 3:
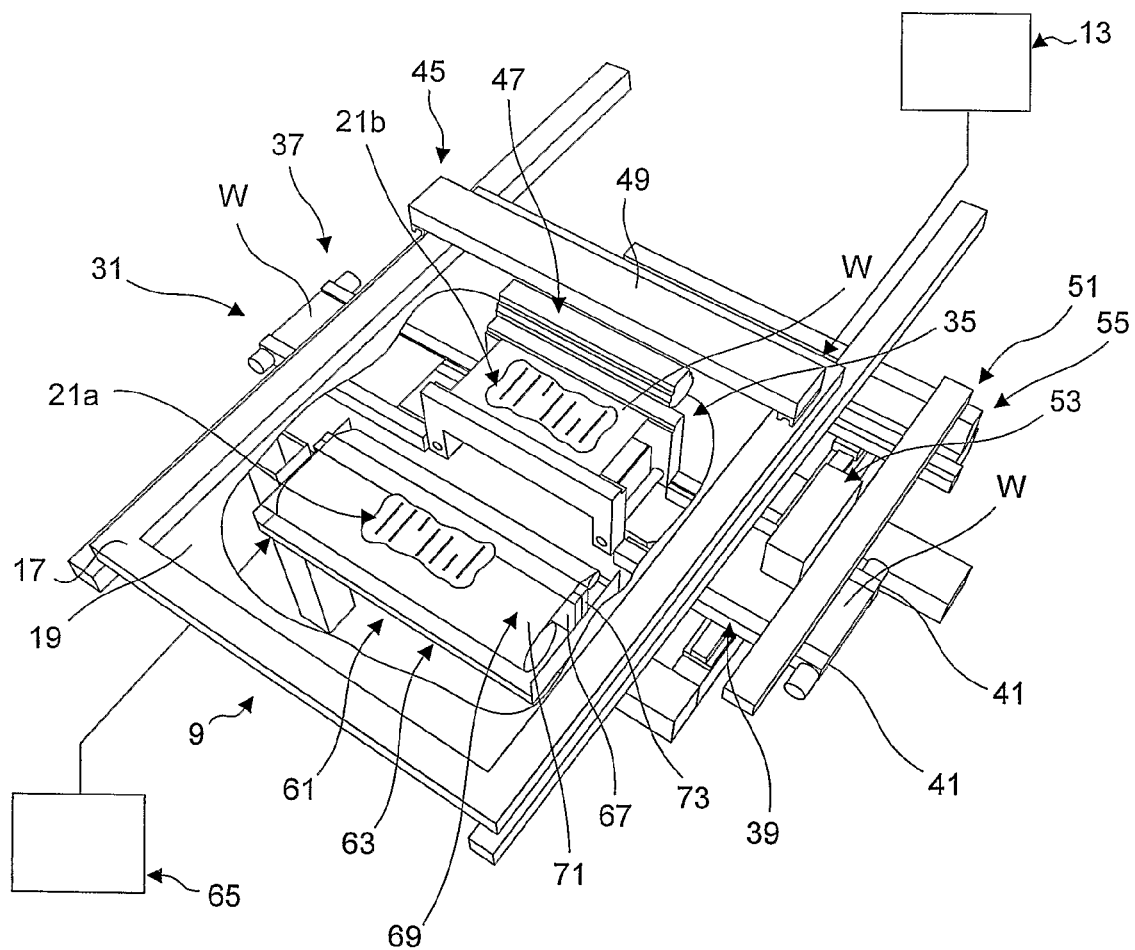
FIG. 3 illustrates the perspective view of FIG. 2, with the screen sheet of the printing screen being partially cut away, again to facilitate understanding.
Figure 5:
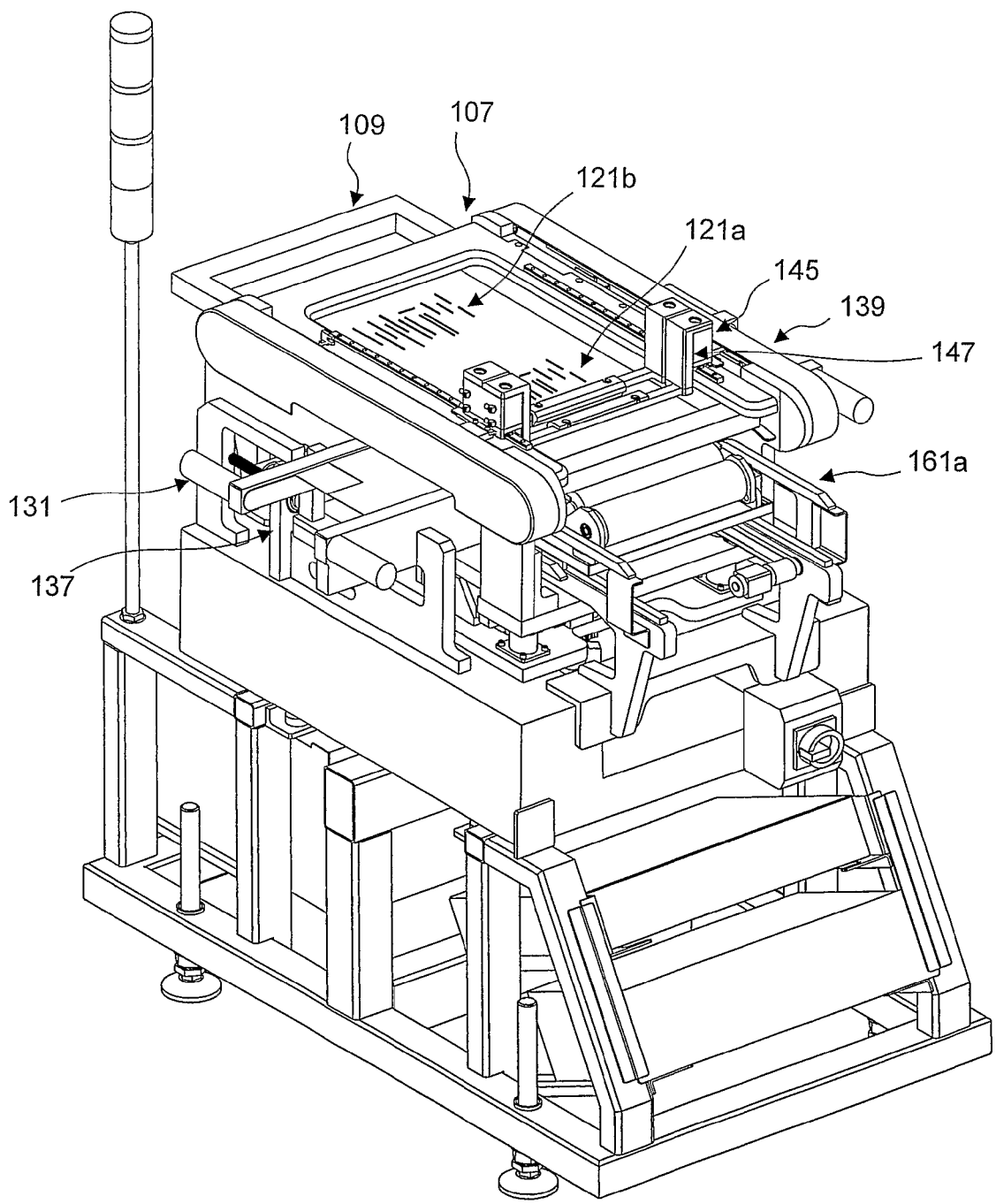
Figure 6:
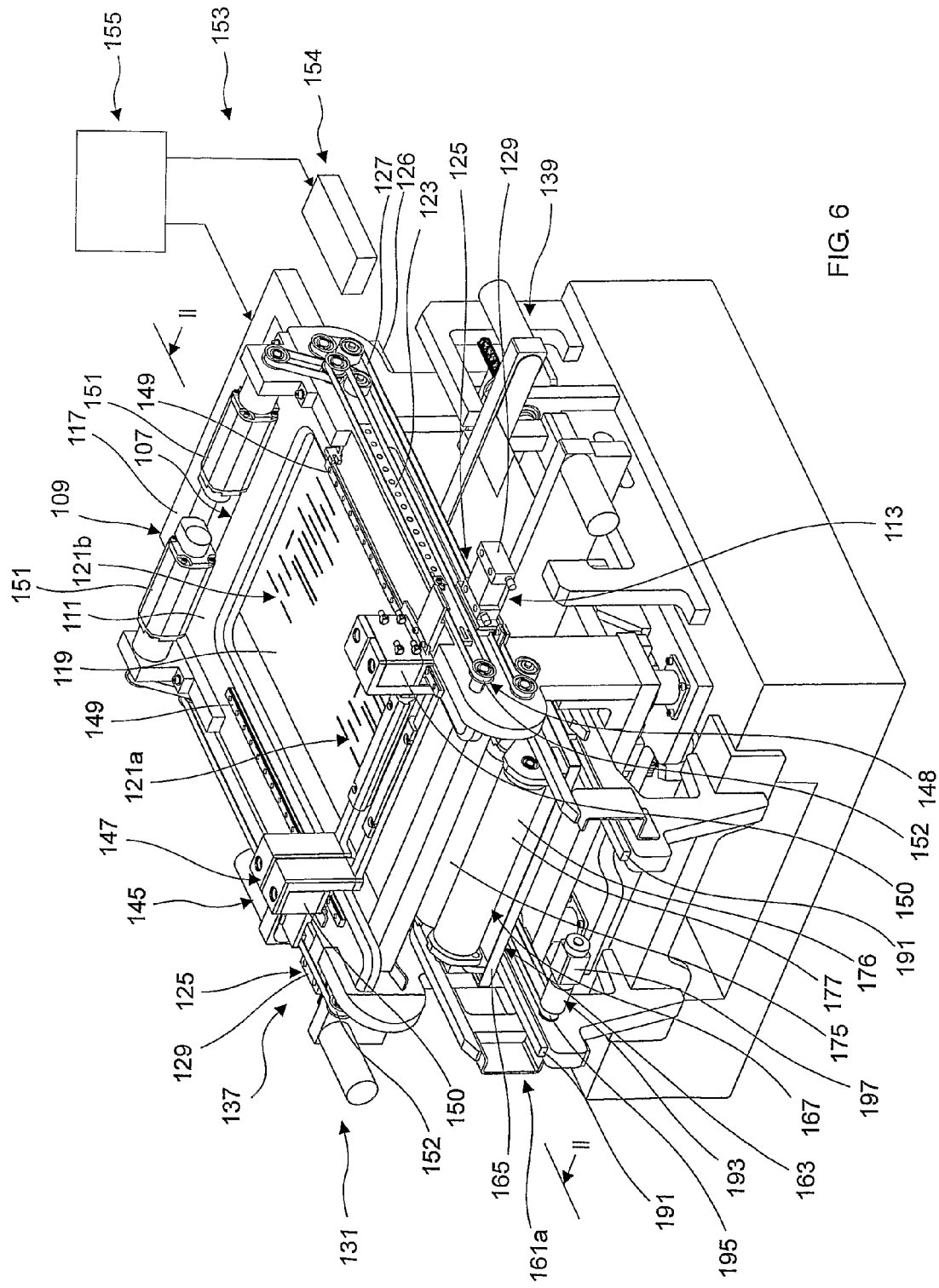
Figure 7:
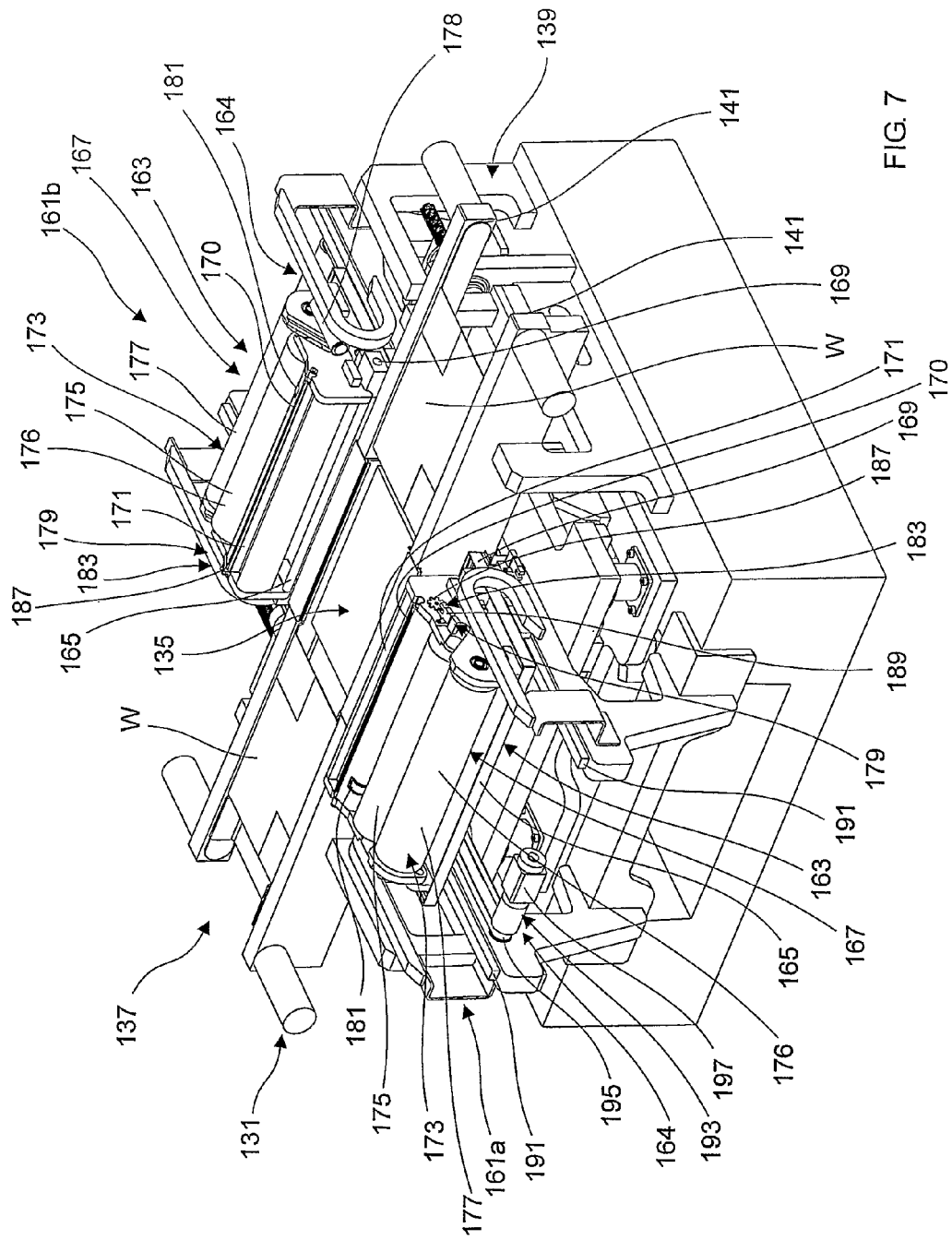
Figure 8:
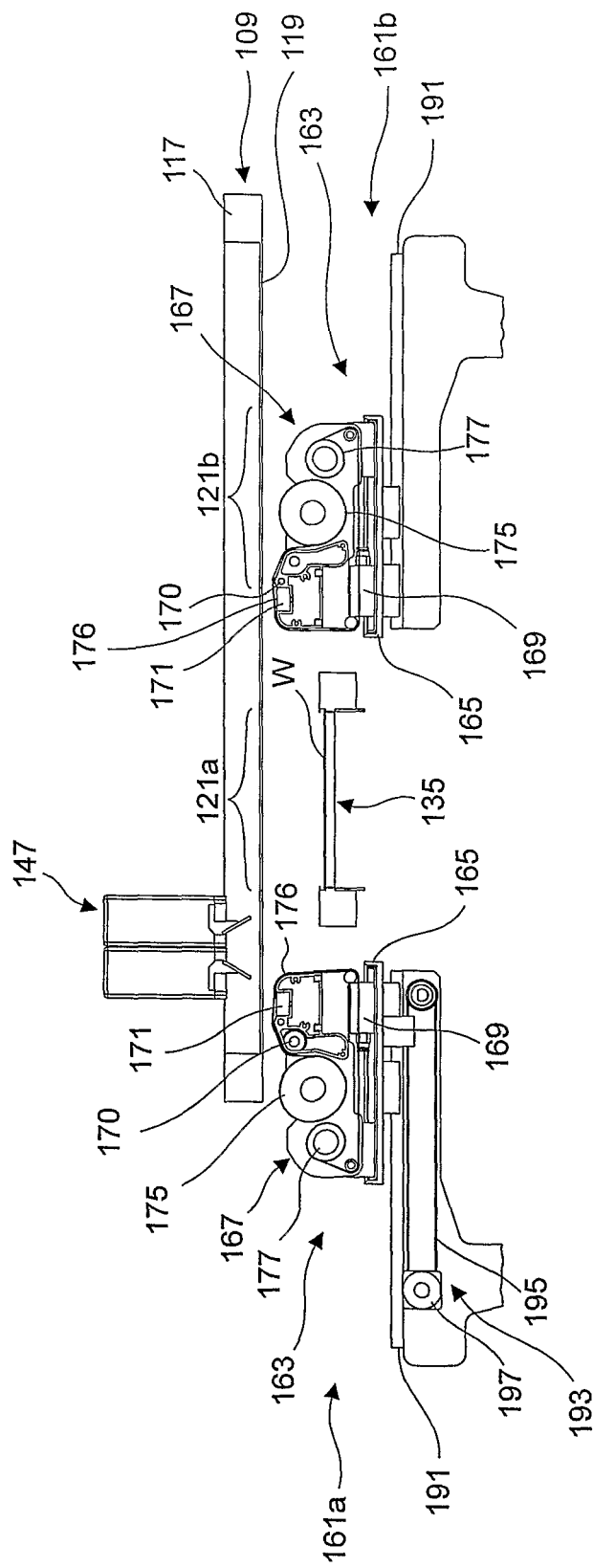
Figure 9A:
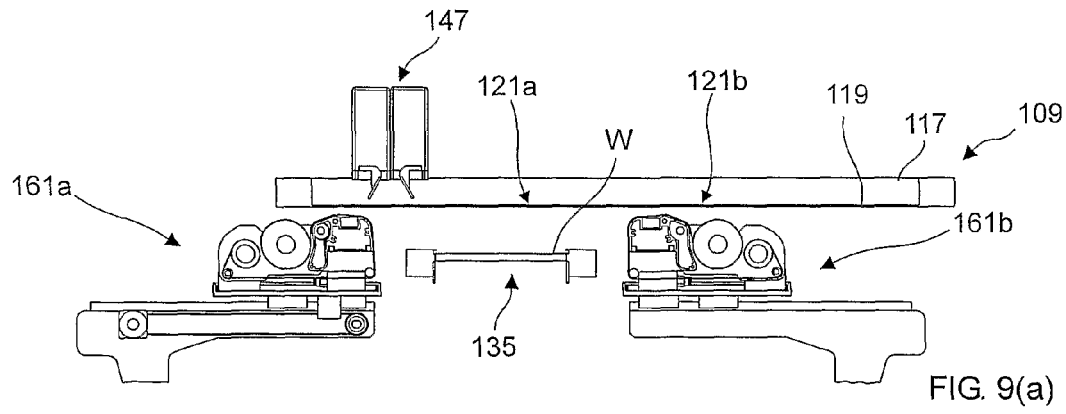
Figure 9B:
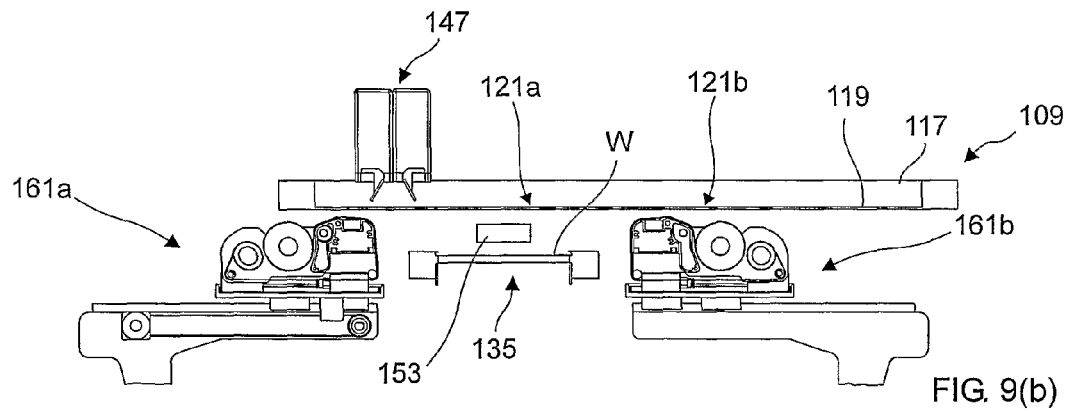
Figure 9C:
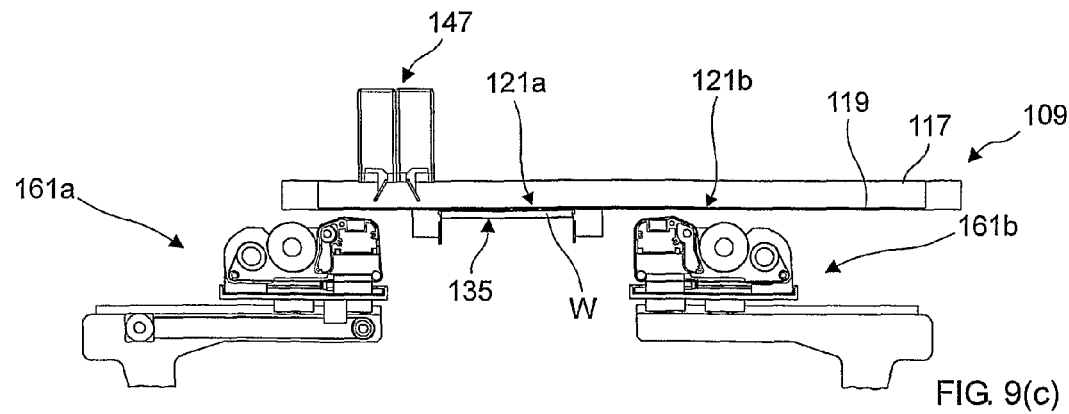
Figure 9D:
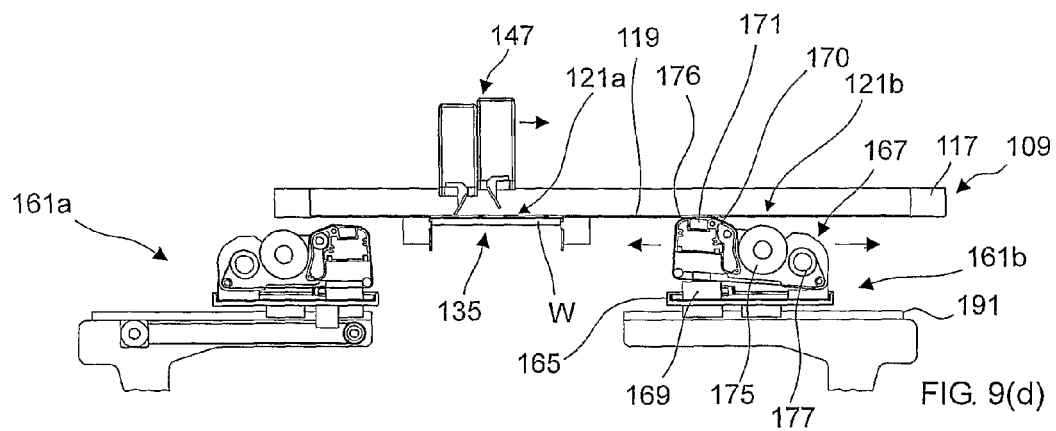
Figure 9E:
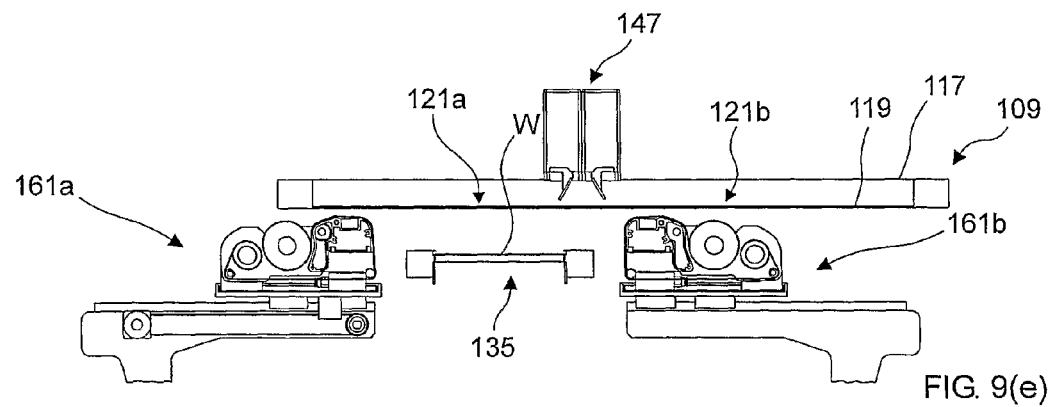
Figure 9F:
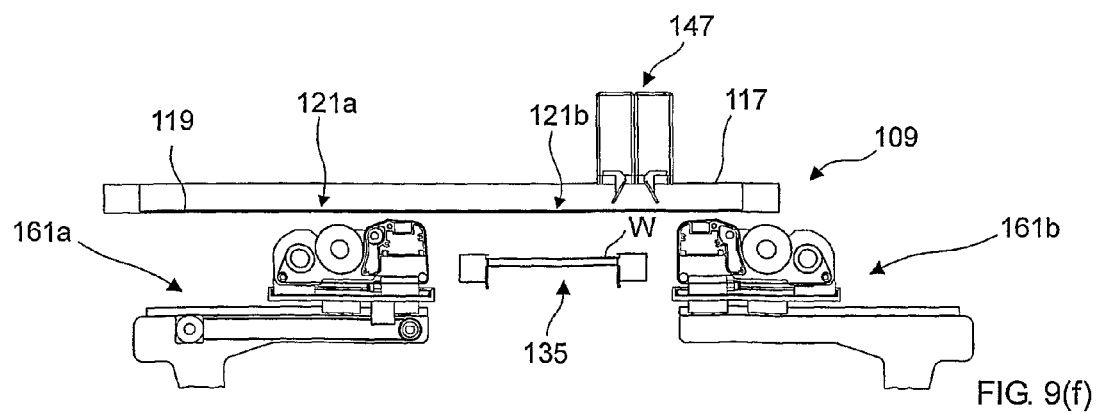
Figure 9G:
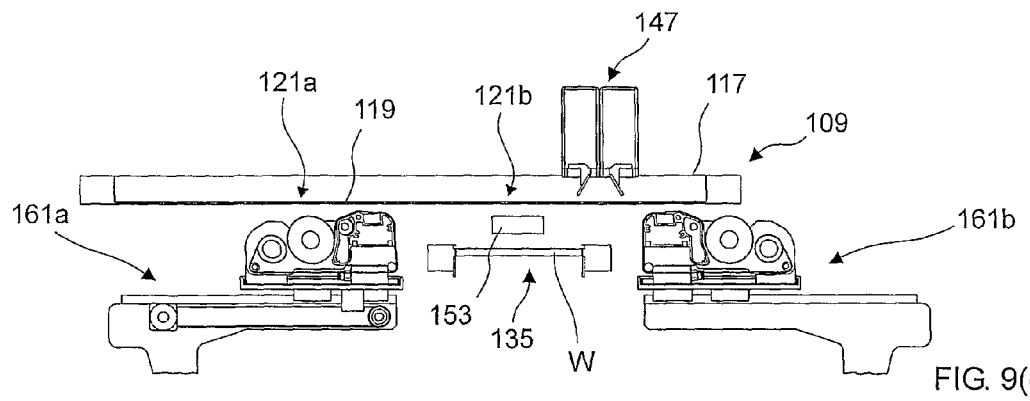
Figure 9H:
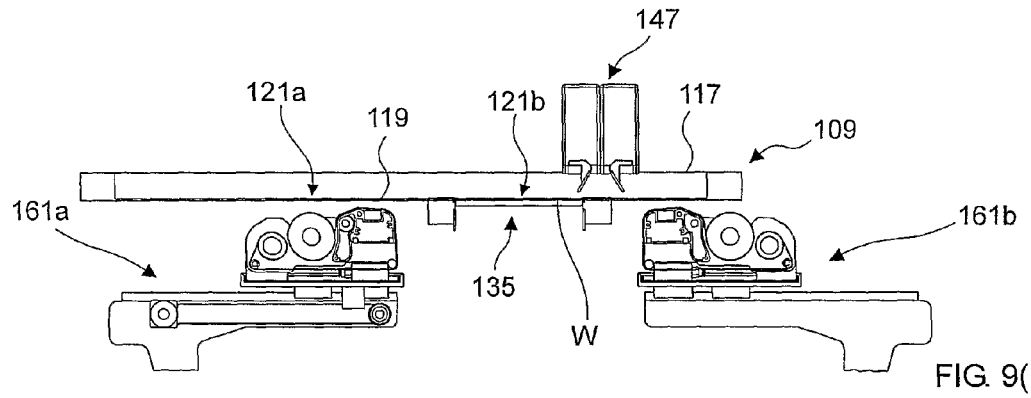
Figure 9I:
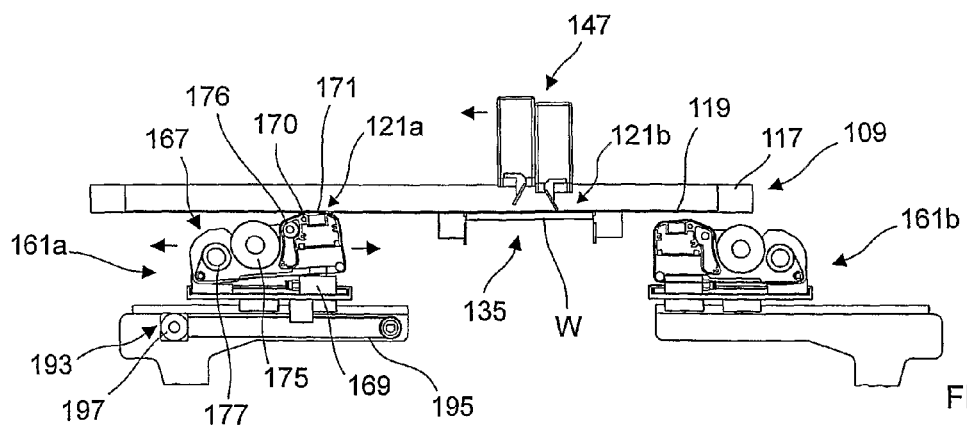
Figure 9J:
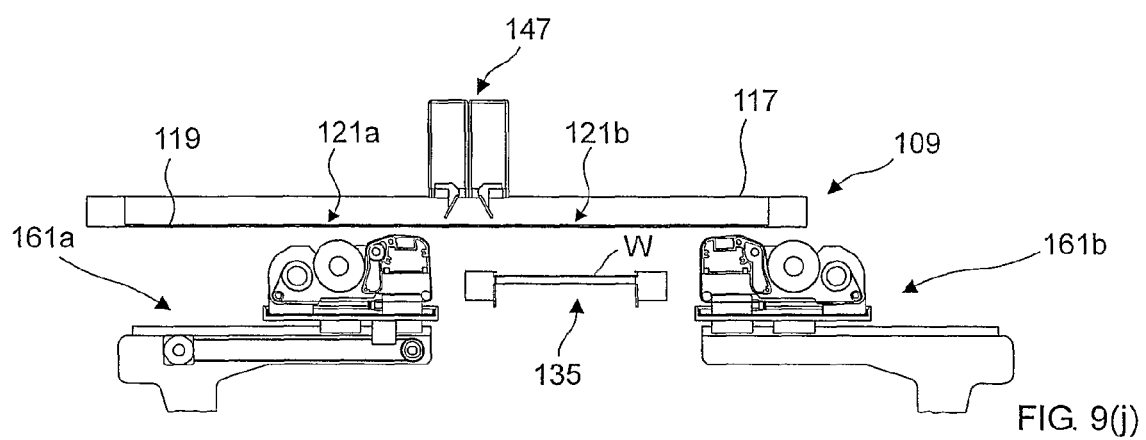

FIGS. 4(a) to (j) illustrate vertical section views (along section I-I in FIG. 2), representing the operation of the screen printing apparatus of FIG. 1;

FIG. 5 illustrates a perspective view of a screen printing apparatus in accordance with a second embodiment of the present invention;

FIG. 6 illustrates a fragmentary, enlarged perspective view of the screen printing apparatus of FIG. 5, with certain of the supporting structure and drive mechanisms being omitted to facilitate understanding;

FIG. 7 illustrates the perspective view of FIG. 6, with the print head unit and the printing screen unit being omitted, again to facilitate understanding;

FIG. 8 illustrates a vertical section view (along section II-II in FIG. 6) of the screen printing apparatus of FIG. 5; and FIGS. 9(a) to (j) illustrate vertical section views (along section II-II in FIG. 6), representing the operation of the screen printing apparatus of FIG. 5.

FIGS. 1 to 4 illustrate a screen printing apparatus in accordance with a first embodiment of the present invention.

The screen printing apparatus comprises a frame support 7, which supports a printing screen unit 9 such as to be movable between first and second printing positions, as will be described in more detail hereinbelow.

In this embodiment the frame support 7 comprises a frame support member 11 on which the printing screen unit 9 is movably supported, here on guide rails, and a drive mechanism 13 which is operative to move the printing screen unit 9 between the first and second printing positions.

The printing screen unit 9 comprises a frame 17, in this embodiment of an elongate rectangular shape, and a screen sheet 19 which is supported to the frame 17 under tension.

In this embodiment the screen sheet 19 comprises one of a metal or plastics sheet, but in another embodiment could comprise a mesh.

In this embodiment the screen sheet 19 includes first and second identical sets of print apertures 21a, 21b through a respective one of which a print medium can be printed to print a pattern of deposits of the print medium onto a workpiece W when supported therebelow.

The screen printing apparatus further comprises a workpiece transport unit 31 for transporting workpieces W to a printing zone beneath the printing screen unit 9.

The workpiece transport unit 31 comprises a plurality of workpiece transport sections 35, 37, 39, which are operative to receive a workpiece W upstream and feed the workpiece W firstly to a printing zone beneath the printing screen unit 9 and then subsequently downstream.

In this embodiment the workpiece transport sections 35, 37, 39 each comprises a pair of parallel support elements 41, in this embodiment belts, which support the respective edges of a workpiece W and are driven to transport a supported workpiece W therealong.

In this embodiment the workpiece transport unit 31 comprises a first, intermediate support section 35, which is operative to support a workpiece W during a printing operation, a second, infeed section 37, which is operative to feed a workpiece W to the support section 35, and an outfeed section 39, which is operative to feed a printed workpiece W downstream from the support section 35.

Figure 4A:
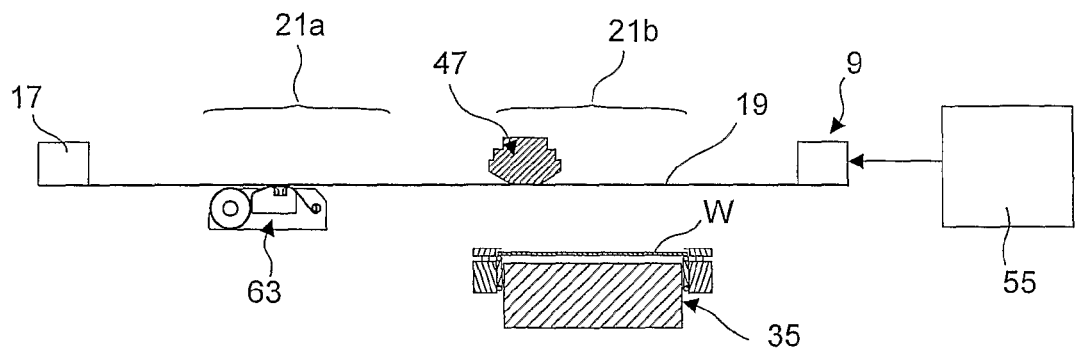
Figure 4B:
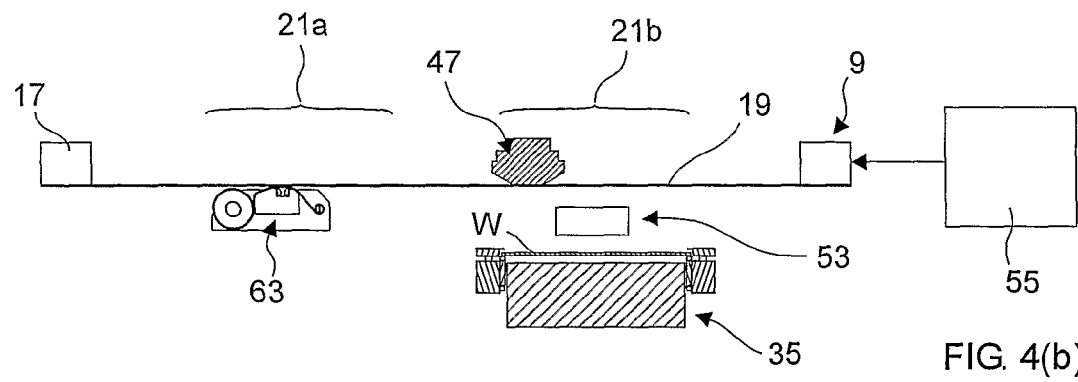
Figure 4C:
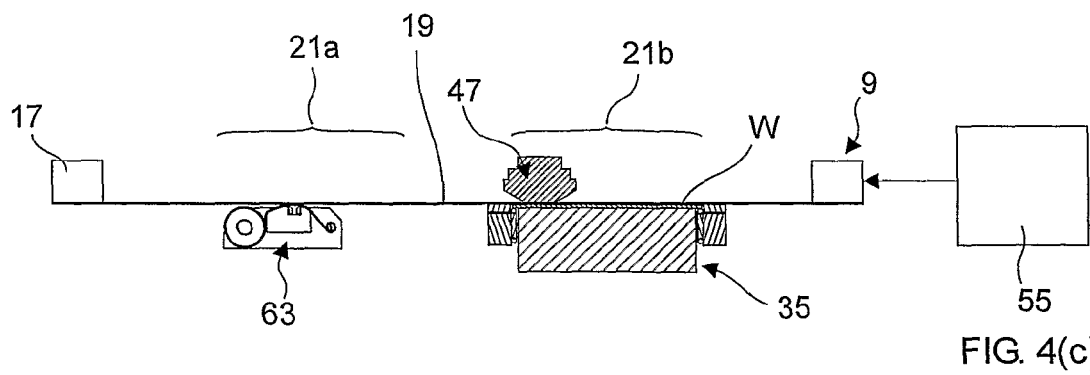

In this embodiment the infeed and outfeed sections 37, 39 have fixed positions, and the support section 35 is movable vertically between a first, lowered transport position, as illustrated in FIG. 4(a), in which a workpiece W can be received from the infeed section 37 and transferred to the outfeed section 39, and a second, raised printing position, as illustrated in FIG. 4(c), in which a workpiece W is supported beneath the screen sheet 19 to allow for printing thereon.

In this embodiment the support section 35 is configured to support a workpiece W in contact with the underside of the screen sheet 19 to provide for on-contact printing.

In an alternative embodiment the support section 35 can be configured to support a workpiece W in off-contact relation with the underside of the screen sheet 19 to provide for off-contact printing.

The screen printing apparatus further comprises a print head unit 45 which is operative to print print medium through a respective one of the sets of print apertures 21a, 21b onto a workpiece W supported therebelow.

In this embodiment the print head unit 45 comprises a print head 47, which is operative to traverse the upper side of the screen sheet 19 to drive print medium through a respective one of the sets of print apertures 21a, 21b in the screen sheet 19 and deposit a pattern of deposits of print medium on a workpiece W supported therebelow, and a drive mechanism 49 for driving the print head 47 over the upper side of the screen sheet 19.

In this embodiment the print head 47 is reciprocatingly movable over the screen sheet 19 in opposite directions to print with each stroke.

In an alternative embodiment the print head 47 could be configured to print when traversed in only one direction, with the print head 47 being returned to the original position prior to performing a subsequent print stroke.

In this embodiment the print head 47 is an enclosed print head, which contains a volume of print medium.

In an alternative embodiment the print head 47 could comprise one or more squeegees.

The screen printing apparatus further comprises a screen alignment unit 51, which is operative to align the printing screen unit 9 relative to a workpiece W supported on the support section 35.

In this embodiment the screen alignment unit 51 comprises a camera 53 for acquiring images of the upper side of a workpiece W supported on the support section 35 and the respective one of the patterns of print apertures 21a, 21b in the screen sheet 19 which is disposed above the support section 35, and an alignment mechanism 55 which is operative, based on any misalignment determined from the acquired images, to align the respective pattern of print apertures 21a, 21b in the screen sheet 19 relative to the supported workpiece W.

The screen printing apparatus further comprises a screen cleaning unit 61 which is operative to clean the underside of the screen sheet 19 at locations corresponding to one of the sets of print apertures 21a, 21b therein.

In this embodiment the screen cleaning unit 61 comprises a screen cleaning head 63 and a drive mechanism 65 for moving the screen cleaning head 63 beneath the screen sheet 19 to locations corresponding to one of the patterns of print apertures 21a, 21b.

In this embodiment the screen cleaning head 63 comprises a solvent applicator 67 for applying a solvent to the underside of the screen sheet 19, a wiping mechanism 69, which includes a wipe element 71, for wiping the underside of the screen sheet 19, and a vacuum source 73 for applying a vacuum to the underside of the screen sheet 19 through the wipe element 71 to collect waste print material.

In this embodiment the wipe element 71 comprises a cleaning roll, a new section of which is presented in each cleaning operation.

In this embodiment the screen cleaning head 63 is moved reciprocatingly over the underside of the screen sheet 19 during each cleaning operation.

Operation of the above-described screen printing apparatus will now be described hereinbelow with reference to FIGS. 4(a) to (j) of the accompanying drawings.

With the printing screen unit 9 in a first printing position and the support section 35 in the lowered, transport position, a workpiece W is fed from the infeed section 37 to the support section 35, as illustrated in FIG. 4(a).

The camera 53 of the screen alignment unit 51 is then moved between the screen sheet 19 and the supported workpiece W to capture images of the upper side of the workpiece W and the respective one of the first and second patterns of print apertures 21a, 21b in the screen sheet 19 thereabove, in this embodiment the second pattern of print apertures 21b, as illustrated in FIG. 4(b).

Based on the acquired images, the alignment mechanism 55 is operated to move the printing screen unit 9 relative to the workpiece W to correct any misalignment between the workpiece W and the second pattern of print apertures 21b in the screen sheet 19.

The support section 35 is then raised to the printing position to locate the supported workpiece W at the underside of the screen sheet 19, as illustrated in FIG. 4(c).

Figure 4D:
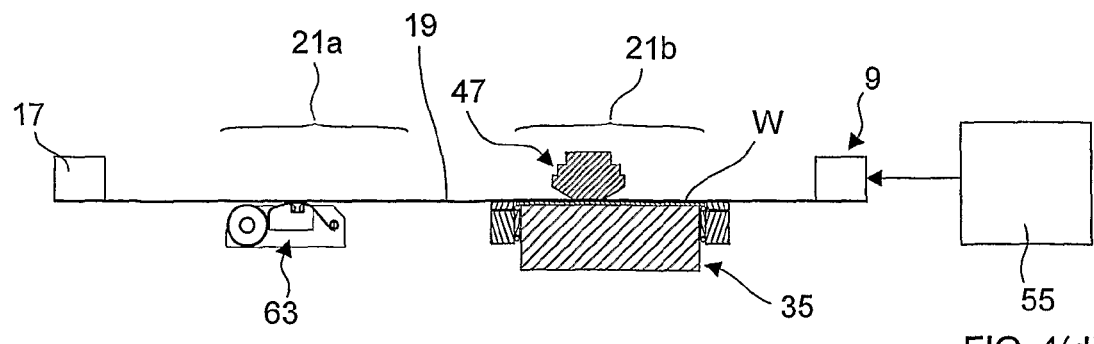

The print head 47 is then driven over the upper side of the screen sheet 19 to force print medium through the second pattern of print apertures 21b in the screen sheet 19 and onto the upper side of the workpiece W therebelow, as illustrated in FIG. 4(d).

Figure 4E:
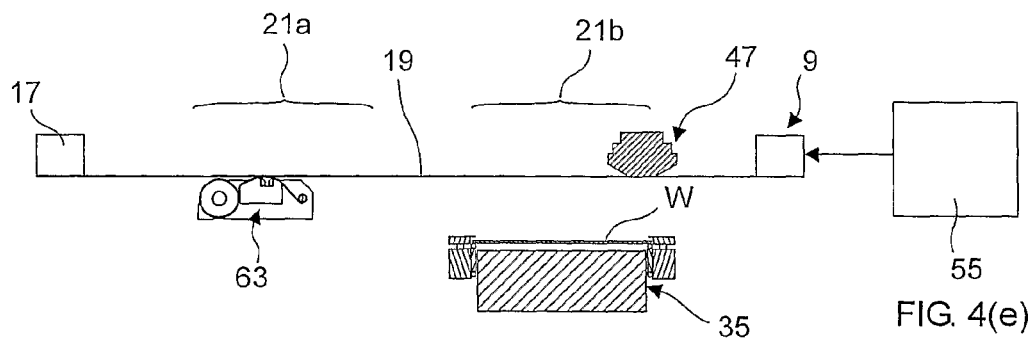

Following this printing operation, the support section 35 is lowered to the lowered, transport position, and the printed workpiece W is fed downstream on the outfeed section 39, as illustrated in FIG. 4(e).

The printing cycle of FIGS. 4(a) to (e), as a first print cycle, is repeated a number of times, depending upon the cleaning requirements for the screen sheet 19. In this embodiment the first printing cycle is repeated a predetermined number of times.

During one or more of the first printing cycles, the screen cleaning head 63 is operated, in a cleaning operation, to clean the underside of the screen sheet 19 at a location corresponding to the other of the first and second patterns of print apertures 21a, 21b, in this embodiment the first pattern of print apertures 21a, in the screen sheet 19. By performing the cleaning operation during performance of one or more of the first printing cycles, the throughput of the screen printing apparatus is not reduced.

Figure 4F:
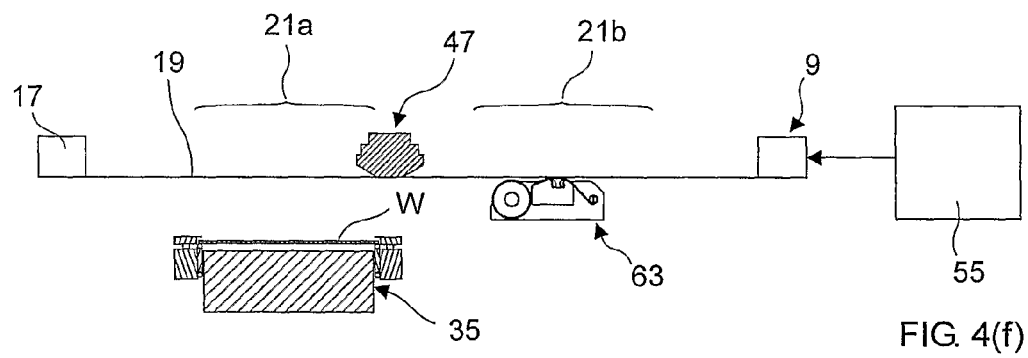

Following completion of a predetermined number of the first printing cycles, the printing screen unit 9 is moved to a second printing position, in which the other of the sets of print apertures 21a, 21b, in this embodiment the first set of print apertures 21a, in the screen sheet 19 is located above the support section 35, and the screen cleaning head 63 is moved to the other side of the support section 35 to a location now corresponding to the one of the sets of print apertures 21a, 21b, in this embodiment the second set of print apertures 21b, in the screen sheet 19, as illustrated in FIG. 4(f).

With the support section 35 in the lowered, transport position, a workpiece W is fed by operation of the infeed section 37 to the support section 35, again as illustrated in FIG. 4(f).

Figure 4G:
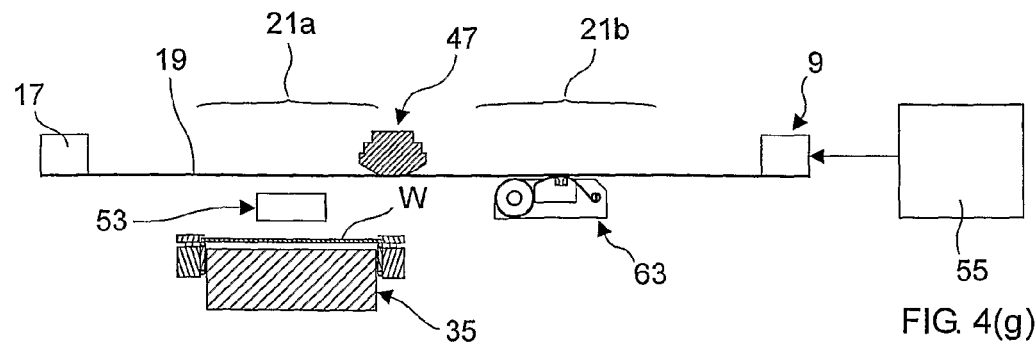

The camera 53 of the screen alignment unit 51 is then moved between the screen sheet 19 and the supported workpiece W to capture images of the upper side of the supported workpiece W and the first set of print apertures 21a in the screen sheet 19 thereabove, as illustrated in FIG. 4(g).

Based on the acquired images, the screen alignment mechanism 55 is operated to move the printing screen unit 9 relative to the workpiece W to correct any misalignment between the workpiece W and the first set of print apertures 21a in the screen sheet 19.

Figure 4H:
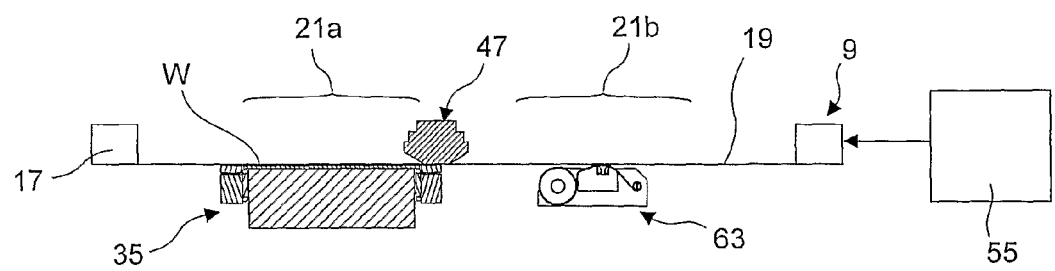

The support section 35 is then raised to the printing position to locate the workpiece W at the underside of the screen sheet 19, as illustrated in FIG. 4(h).

Figure 4I:
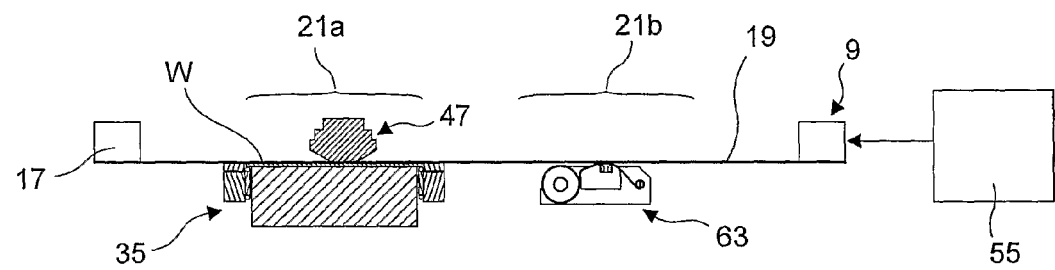

The print head 47 is then driven over the upper side of the screen sheet 19 to force print medium through the first set of print apertures 21a in the screen sheet 19 and onto the upper side of the workpiece W therebelow, as illustrated in FIG. 4(i).

Figure 4J:
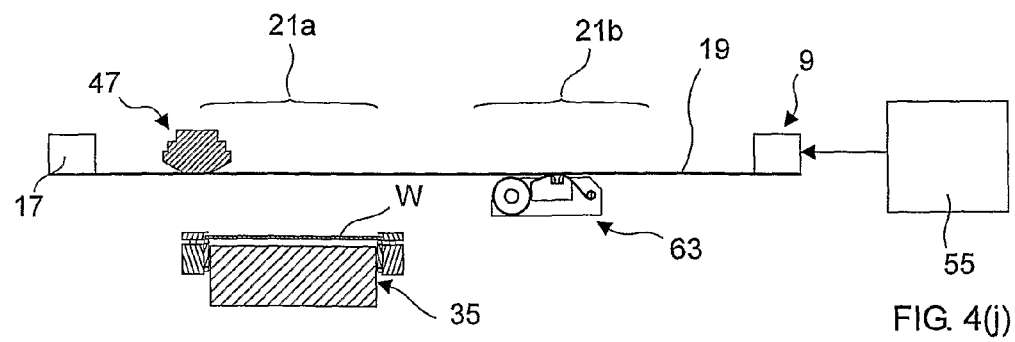

Following this printing operation, the support section 35 is lowered to the transport position, and the printed workpiece W is fed downstream on the outfeed section 39, as illustrated in FIG. 4(j).

The printing cycle of FIGS. 4(f) to (j), as a second print cycle, is repeated a number of times, depending upon the cleaning requirements for the screen sheet 19. In this embodiment the second print cycle is repeated a predetermined number of times.

During performance of one or more of the second print cycles, the screen cleaning head 63 is operated, in a second cleaning operation, to clean the underside of the screen sheet 19 at a location corresponding to the second set of print apertures 21b in the screen sheet 19. By performing the second cleaning operation during performance of one or more of the second print cycles, the throughput of the screen printing apparatus is not reduced.

Following completion of a predetermined number of the second print cycles, the printing screen unit 9 is moved back to the first printing position and the screen cleaning head 63 is moved back to the one side of the support section 35, as illustrated in FIG. 4(a), and the above-described process is repeated.

FIGS. 5 to 9 illustrate a screen printing apparatus in accordance with a second embodiment of the present invention.

The screen printing apparatus comprises a frame support 107, which supports a printing screen unit 109 and is operative to move the printing screen unit 109 between first and second printing positions, as will be described in more detail hereinbelow.

In this embodiment the frame support 107 comprises a frame support member 111 which supports the printing screen unit 109 and a drive mechanism 113 which is operative to move the printing screen unit 109 between the first and second printing positions.

The printing screen unit 109 comprises a frame 117, in this embodiment of an elongate rectangular shape, and a screen sheet 119 which is supported to the frame 117 under tension.

In this embodiment the screen sheet 119 comprises one of a metal or plastics sheet, but in another embodiment could comprise a mesh.

In this embodiment the screen sheet 119 includes first and second identical sets of print apertures 121a, 121b through a respective one of which a print medium can be printed to print a pattern of deposits of the print medium onto a workpiece W when supported therebelow.

In this embodiment the printing screen drive mechanism 113 comprises first and second guide rails 123, 123, here linear bearings, which are disposed to opposite sides of the frame support member 111, first and second carriages 125, 125 which are movably supported on respective ones of the first and second guide rails 123, 123 and operatively coupled to respective sides of the frame 117 of the printing screen unit 109, and first and second actuators 126, 126, here drive motors, which, through first and second drive elements 127, 127, are coupled to respective ones of the first and second carriages 125, 125, such that, when driven, the carriages 125, 125 are moved along the guide rails 123, 123, whereby the printing screen unit 109 can be positioned in one of the first and second printing positions.

In this embodiment the first and second carriages 125, 125 each include an actuator 129, here a pneumatic actuator, which is actuatable to engage and grip the respective side of the frame 117 of the printing screen unit 109 during movement of the printing screen unit 109.

The screen printing apparatus further comprises a workpiece transport unit 131 for transporting workpieces W to a printing zone beneath the printing screen unit 109.

The workpiece transport unit 131 comprises a plurality of workpiece transport sections 135, 137, 139, which are operative to receive a workpiece W upstream and feed the workpiece W firstly to a printing zone beneath the printing screen unit 109 and then subsequently downstream.

In this embodiment the workpiece transport sections 135, 137, 139 each comprises a pair of parallel support elements 141, in this embodiment belts, which support the respective edges of a workpiece W and are driven to transport a supported workpiece W therealong.

In this embodiment the workpiece transport unit 131 comprises a first, intermediate support section 135, which is operative to support a workpiece W during a printing operation, a second, infeed section 137, which is operative to feed a workpiece W to the support section 135, and an outfeed section 139, which is operative to feed a printed workpiece W downstream from the support section 135.

In this embodiment the infeed and outfeed sections 137, 139 have fixed positions, and the support section 135 is movable vertically between a first, lowered transport position, as illustrated in FIG. 8(a), in which a workpiece W can be received from the infeed section 137 and transferred to the outfeed section 139, and a second, raised printing position, as illustrated in FIG. 8(c), in which a workpiece W is supported beneath the screen sheet 119 to allow for printing thereon.

In this embodiment the support section 135 is configured to support a workpiece W in contact with the underside of the screen sheet 119 to provide for on-contact printing.

In an alternative embodiment the support section 135 can be configured to support a workpiece W in off-contact relation with the underside of the screen sheet 119 to provide for off-contact printing.

The screen printing apparatus further comprises a print head unit 145 which is operative to print print medium through a respective one of the sets of print apertures 121a, 121b onto a workpiece W supported therebelow.

In this embodiment the print head unit 145 comprises a print head 147, which is operative to traverse the upper side of the screen sheet 119 to drive print medium through a respective one of the sets of print apertures 121a, 121b in the screen sheet 119 and deposit a pattern of deposits of print medium on a workpiece W supported therebelow, and a print head drive mechanism 148 for driving the print head 147 over the upper side of the screen sheet 119.

In this embodiment the print head drive mechanism 148 comprises first and second guide rails 149, 149, here linear bearings, which are disposed to opposite sides of the frame support member 111, first and second carriages 150, 150 to which the opposite ends of the print head 147 are coupled and which are movably supported on respective ones of the first and second guide rails 149, 149, and first and second actuators 151, 151, here drive motors, which, through first and second drive elements 152, 152, are coupled to respective ones of the first and second carriages 150, 150, such that, when driven, the carriages 150, 150 are moved along the guide rails 149, 149, whereby the print head 147 is traversed over the upper side of the screen sheet 119.

In this embodiment the print head 147 is reciprocatingly movable over the screen sheet 119 in opposite directions to print with each stroke.

In an alternative embodiment the print head 147 could be configured to print when traversed in only one direction, with the print head 147 being returned to the original position prior to performing a subsequent print stroke.

In this embodiment the print head 147 comprises one or more squeegees, here a pair of oppositely-facing squeegees.

In an alternative embodiment the print head 147 could comprise an enclosed print head, which contains a volume of print medium.

The screen printing apparatus further comprises a screen alignment unit 153, which is operative to align the printing screen unit 109 relative to a workpiece W supported on the support section 135.

In this embodiment the screen alignment unit 153 comprises a camera 154 for acquiring images of the upper side of a workpiece W supported on the support section 135 and the respective one of the patterns of print apertures 121a, 121b in the screen sheet 119 which is disposed above the support section 135, and an alignment mechanism 155 which is operative, based on any mis-alignment determined from the acquired images, to align the respective pattern of print apertures 121a, 121b in the screen sheet 119 relative to the supported workpiece W.

The screen printing apparatus further comprises first and second screen cleaning units 161a, 161b which are disposed to opposite sides of the support section 135 and operative to clean the underside of the screen sheet 119 at locations corresponding to a respective one of the first and second sets of print apertures 121a, 121b therein when the printing screen unit 109 is in a respective one of the first and second printing positions.

In this embodiment the screen cleaning units 161a, 161b each comprise a cleaning head unit 163, and a cleaning head drive mechanism 164 for moving the cleaning head unit 163 beneath the screen sheet 119 to clean the same.

In this embodiment the cleaning head unit 163 comprises a support member 165, here a tray, a screen cleaning head 167 which is pivotally coupled to the support member 165, and an actuator 169, here a pneumatic cylinder, which is operative to pivot the screen cleaning head 167 between a lowered, inoperative position and a raised, operative cleaning position.

In this embodiment the screen cleaning head 167 comprises a solvent applicator 170, here an elongate solvent feed bar, for delivering a solvent to clean the underside of the screen sheet 119, a vacuum source 171, here an elongate vacuum bar, for applying a vacuum to the underside of the screen sheet 119 to collect waste print medium, and a wiping mechanism 173 for wiping the underside of the screen sheet 119.

In this embodiment the wiping mechanism 173 comprises a supply roll 175 of a wipe element 176, here a cleaning paper, which is fed over the solvent applicator 170 and the vacuum source 171, and a take-up spool 177 which is operative to draw a new section of the wipe element 176 from the supply roll 175 for each cleaning operation.

In this embodiment the wiping mechanism 173 includes an actuator 178, here a drive motor, for driving the take-up spool 177 to draw up a section of the wipe element 176, and a sensor assembly 179 for determining an amount of the wipe element 176 which is drawn with each operation of the take-up spool 177.

In this embodiment the sensor assembly 179 comprises a rotatable element 181, here a wheel, which is configured to engage the wipe element 176 and be rotated as the wipe element 176 is drawn thereover, and a sensor 183 which is operative to sense an extent of the rotation of the rotatable element 181 and thereby determine the length of the wipe element 176 which is drawn onto the take-up spool 177.

In this embodiment the sensor 183 comprises an apertured vane element 187 which is coupled to the rotatable element 181 and commonly rotated therewith, and an optical sensor element 189 which determines the extent of the rotation of the vane element 187 by counting the number of apertures sensed with rotation thereof.

In this embodiment the supply roll 175 and the take-up spool 177 are located to one, the same outer side of the solvent applicator 170 and the vacuum source 171. With this configuration, the active cleaning area, which is defined by the vacuum source 171 can be arranged more closely to the workpiece transport unit 131, thereby enabling the sets of patterns of print apertures 121*a*, 121*b* in the screen sheet 119 to be located more closely together, which has the particular advantage of requiring less movement of the printing screen unit 109 when being moved between the first and second printing positions.

In this embodiment the cleaning head drive mechanism 164 comprises first and second guide rails 191, 191, here linear bearings, on which the support member 165 of the cleaning head unit 163 is movably disposed, and an actuator 193 for driving the support member 165 over the guide rails 191, 191, in this embodiment with a reciprocating motion.

In this embodiment the actuator 193 comprises a drive belt 195 which is coupled to the support member 165 and a drive motor 197 which is operative to drive the drive belt 195.

Operation of the above-described screen printing apparatus will now be described hereinbelow with reference to FIGS. 9(*a*) to (*j*) of the accompanying drawings.

With the printing screen unit 109 in a first printing position and the support section 135 in the lowered, transport position, a workpiece W is fed from the infeed section 137 to the support section 135, as illustrated in FIG. 9(*a*).

The camera 154 of the screen alignment unit 153 is then moved between the screen sheet 119 and the supported workpiece W to capture images of the upper side of the workpiece W and the respective one of the first and second patterns of print apertures 121*a*, 121*b* in the screen sheet 19 thereabove, in this embodiment the first pattern of print apertures 121*a*, as illustrated in FIG. 9(*b*).

Based on the acquired images, the alignment mechanism 155 is operated to move the printing screen unit 109 relative to the workpiece W to correct any misalignment between the workpiece W and the first pattern of print apertures 121*a* in the screen sheet 119.

The support section 135 is then raised to the printing position to locate the supported workpiece W at the underside of the screen sheet 119, as illustrated in FIG. 9(*c*).

The print head 147 is then driven over the upper side of the screen sheet 119 to force print medium through the first pattern of print apertures 121*a* in the screen sheet 119 and onto the upper side of the workpiece W therebelow, as illustrated in FIG. 9(*d*).

Following this printing operation, the support section 135 is lowered to the lowered, transport position, and the printed workpiece W is fed downstream on the outfeed section 139, as illustrated in FIG. 9(*e*).

The printing cycle of FIGS. 9(*a*) to (*e*), as a first print cycle, is repeated a number of times, depending upon the cleaning requirements for the screen sheet 119. In this embodiment the first printing cycle is repeated a predetermined number of times.

During one or more of the first printing cycles, the second screen cleaning unit 161*b* is operated, in a cleaning operation, as illustrated in FIG. 9(*d*), to clean the underside of the screen sheet 119 at a location corresponding to the other of the first and second patterns of print apertures 121*a*, 121*b*, in this embodiment the second pattern of print apertures 121*b*, in the screen sheet 119. By performing the cleaning operation during performance of one or more of the first printing cycles, the throughput of the screen printing apparatus is not reduced.

Following completion of a predetermined number of the first printing cycles, the printing screen unit 109 is moved to a second printing position, in which the other of the first and second sets of print apertures 121*a*, 121*b*, in this embodiment the second set of print apertures 121*b*, in the screen sheet 119 is located above the support section 135, and the one of the first and second sets of print apertures 121*a*, 121*b*, in this embodiment the first set of print apertures 121*a*, is located above the first screen cleaning unit 161*a*, as illustrated in FIG. 9(*f*).

With the support section 135 in the lowered, transport position, a workpiece W is fed by operation of the infeed section 137 to the support section 135, again as illustrated in FIG. 9(*f*).

The camera 154 of the screen alignment unit 153 is then moved between the screen sheet 119 and the supported workpiece W to capture images of the upper side of the supported workpiece W and the second set of print apertures 121*b* in the screen sheet 119 thereabove, as illustrated in FIG. 9(*g*).

Based on the acquired images, the screen alignment mechanism 155 is operated to move the printing screen unit 109 relative to the workpiece W to correct any misalignment between the workpiece W and the second set of print apertures 121*b* in the screen sheet 119.

The support section 135 is then raised to the printing position to locate the workpiece W at the underside of the screen sheet 119, as illustrated in FIG. 9(*h*).

The print head 147 is then driven over the upper side of the screen sheet 119 to force print medium through the second set of print apertures 121*b* in the screen sheet 119 and onto the upper side of the workpiece W therebelow, as illustrated in FIG. 9(*i*).

Following this printing operation, the support section 135 is lowered to the transport position, and the printed workpiece W is fed downstream on the outfeed section 139, as illustrated in FIG. 9(*j*).

The printing cycle of FIGS. 9(*f*) to (*j*), as a second print cycle, is repeated a number of times, depending upon the cleaning requirements for the screen sheet 119. In this embodiment the second print cycle is repeated a predetermined number of times.

During performance of one or more of the second print cycles, the first screen cleaning unit 161*a* is operated, in a second cleaning operation, as illustrated in FIG. 9(*i*), to clean the underside of the screen sheet 119 at a location corresponding to the first set of print apertures 121*a* in the screen sheet 119. By performing the second cleaning operation during performance of one or more of the second print cycles, the throughput of the screen printing apparatus is not reduced.

Following completion of a predetermined number of the second print cycles, the printing screen unit 109 is moved back to the first printing position, as illustrated in FIG. 9(*a*), and the above-described process is repeated.

In this embodiment the provision of two screen cleaning units 161*a*, 161*b* avoids the need to move the screen cleaning units 161*a*, 161*b* to opposite sides of the workpiece transport unit 131, which has the particular advantage of allowing the spacing between the two sets of print apertures 121*a*, 121*b* to be reduced, which allows either for the use of a smaller printing screen unit 109, which provides for a reduced footprint of the screen printing apparatus, or alternatively allows for wider sets of print apertures 121*a*, 121*b* and workpieces W to be handled for a given footprint of the screen printing apparatus.

Finally, it will be understood that the present invention has been described in its preferred embodiments and can be modified in many different ways without departing from the scope of the invention as defined by the appended claims.

The invention claimed is:

1. A screen printing apparatus for printing deposits of a print medium on workpieces, the apparatus comprising:
   a frame support unit for supporting a printing screen unit in first and second printing positions, wherein the printing screen unit comprises a screen sheet which includes first and second sets of print apertures and a positioning mechanism for positioning the printing screen unit in one of the first and a second printing positions;
   a workpiece support unit operable to support a workpiece adjacent an underside of the screen sheet;
   a print head unit which includes a print head for driving a print medium through one of the first and second sets of print apertures in the screen sheet to print a pattern of deposits on a workpiece supported on the workpiece support unit; and
   at least one single screen cleaning unit which includes a cleaning head unit for cleaning the underside of the screen sheet, wherein the cleaning head unit is movable between first and second screen cleaning locations at opposite sides of the workpiece support unit, whereby the cleaning head unit is operative to clean the underside of the screen sheet at a location corresponding to the second set of print apertures when in the first screen cleaning location and with the printing screen unit in the first printing position and a location corresponding to the first set of print apertures when in the second screen cleaning location and with the printing screen unit in the second printing position;
   wherein the screen cleaning unit and the print head unit are operable in parallel, whereby, when the printing screen unit is in the first printing position, the screen cleaning unit is in the first screen cleaning location and cleans the underside of the screen sheet at a location corresponding to the second set of print apertures and at the same time the print head unit prints print medium onto workpieces through the first set of print apertures, and, when the printing screen unit is in the second printing position, the screen cleaning unit is in the second screen cleaning location and cleans the underside of the screen sheet at a location corresponding to the first set of print apertures and at the same time the print head unit prints print medium onto workpieces through the second sets of print apertures.

2. The apparatus of claim 1, wherein the print head comprises one of an enclosed print head or a squeegee mechanism.

3. The apparatus of claim 1, wherein the workpiece support unit includes a support section which is movable between a first, receiving position in which a workpiece is received thereon and a second, printing position in which a workpiece is supported adjacent the underside of the screen sheet.

4. The apparatus of claim 1, wherein the screen cleaning unit comprises a cleaning head drive mechanism for (a) moving the cleaning head unit beneath the screen sheet to clean the underside of the screen sheet or (b) moving the cleaning head unit with a reciprocal motion beneath the screen sheet to clean the underside of the screen sheet.

5. The apparatus of claim 1, wherein the cleaning head unit comprises a support member, a screen cleaning head which is movably coupled to the support member, and an actuator which is operative to move the screen cleaning head between an inoperative position and an operative cleaning position.

6. The apparatus of claim 5, wherein the screen cleaning head comprises a solvent applicator for delivering a solvent to clean the underside of the screen sheet, a vacuum source for applying a vacuum to the underside of the screen sheet to collect waste print medium, and a wiping mechanism for wiping the underside of the screen sheet.

7. The apparatus of claim 6, wherein the wiping mechanism comprises a supply of a wipe element, which is fed over the solvent applicator and the vacuum source, and a take-up spool which is operative to draw a new section of the wipe element from the supply for each cleaning operation.

8. The apparatus of claim 7, wherein the wiping mechanism includes an actuator for driving the take-up spool to draw up a section of the wipe element, and a sensor assembly for determining an amount of the wipe element which is drawn with each operation of the take-up spool.

9. The apparatus of claim 7, wherein the supply and the take-up spool are located to one, outer side of the solvent applicator and the vacuum source.

10. The apparatus of claim 1, wherein the first and second sets of print apertures are identical.

11. A method of printing deposits of a print medium onto workpieces, the method comprising the steps of:
    providing a printing screen unit which comprises a screen sheet which includes first and second sets of print apertures and a frame support unit which comprises a positioning mechanism for positioning the printing screen unit in one of first and second printing positions;
    successively supporting workpieces to an underside of the screen sheet by a workpiece support unit;
    performing one or more first print cycles on workpieces successively supported by the workpiece support unit to the underside of the screen sheet at a location corresponding to the first set of print apertures;
    performing a first cleaning operation on the underside of the screen sheet at a location corresponding to the second set of print apertures during the step of one or more of the first print cycles;
    positioning the printing screen unit in a first printing position when performing the one or more first print cycles and the first cleaning operation;
    by the work piece support unit to the underside of the screen sheet at a location corresponding to the second set of print apertures;
    performing a second cleaning operation on the underside of the screen sheet at a location corresponding to the first set of print apertures during the step of performing one or more of the second print cycles; and
    positioning the printing screen unit in a second printing position when performing the one or more second print cycles and the second cleaning operation;
    wherein the first and second cleaning operations are performed by a single screen cleaning unit, which comprises a cleaning head unit which is movable between first and second cleaning locations at opposite sides of the workpiece support unit, whereby the cleaning head unit performs the first cleaning operation when in the first screen cleaning location and with the printing screen unit in the first printing position and the second cleaning operation when in the second screen cleaning location and with the printing screen unit in the second printing position.

12. The method of claim 11, wherein the workpieces are supported successively by a support section of the workpiece support unit which is movable between a first, receiving position in which a workpiece is received thereon and a second, printing position in which a workpiece is supported adjacent the underside of the screen sheet.

13. The method of claim 11, wherein the first and second cleaning operations are performed by first and second screen cleaning units disposed at locations to opposite sides of the supported workpiece, wherein the first screen cleaning unit performs the first cleaning operation when the printing screen unit is in the first printing position and the second cleaning operation when the printing screen unit is in the second printing position.

14. The method of claim 13, wherein the screen cleaning units are (a) moved beneath the screen sheet to clean the underside of the screen sheet or (b) moved beneath the screen sheet with a reciprocal motion to clean the underside of the screen sheet.

15. The method of claim 13, wherein the cleaning head unit comprises a support member, a screen cleaning head which is movably coupled to the support member, and an actuator which is operative to move the screen cleaning head between an inoperative position and an operative cleaning position.

16. The method of claim 15, wherein the screen cleaning head comprises a solvent applicator for delivering a solvent to clean the underside of the screen sheet, a vacuum source for applying a vacuum to the underside of the screen sheet to collect waste print medium, and a wiping mechanism for wiping the underside of the screen sheet.

17. The method of claim 16, wherein the wiping mechanism comprises a supply of a wipe element, which is fed over the solvent applicator and the vacuum source, and a take-up spool which is operative to draw a new section of the wipe element from the supply for each cleaning operation.

18. The method of claim 17, wherein the supply and the take-up spool are located to one, outer side of the solvent applicator and the vacuum source.

19. The method of claim 11, wherein the first and second sets of print apertures are identical.

* * * * *